(12) United States Patent
Honke et al.

(10) Patent No.: US 10,221,501 B2
(45) Date of Patent: *Mar. 5, 2019

(54) SILICON CARBIDE SUBSTRATE

(71) Applicant: SUMITOMO ELECTRIC INDUSTRIES, LTD., Osaka-shi, Osaka (JP)

(72) Inventors: Tsubasa Honke, Itami (JP); Kyoko Okita, Itami (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/989,373

(22) Filed: May 25, 2018

(65) Prior Publication Data

US 2018/0274129 A1 Sep. 27, 2018

Related U.S. Application Data

(63) Continuation of application No. 15/527,121, filed as application No. PCT/JP2015/081027 on Nov. 4, 2015, now Pat. No. 10,030,319.

(30) Foreign Application Priority Data

Nov. 27, 2014 (JP) ................................. 2014-240106

(51) Int. Cl.
*H01L 29/04* (2006.01)
*C30B 33/12* (2006.01)
(Continued)

(52) U.S. Cl.
CPC ................ *C30B 33/12* (2013.01); *B08B 3/08* (2013.01); *B24B 37/00* (2013.01); *B24B 37/044* (2013.01); *C01B 32/956* (2017.08); *C09G 1/02* (2013.01); *C09K 3/14* (2013.01); *C09K 3/1409* (2013.01); *C30B 29/36* (2013.01); *C30B 33/10* (2013.01); *H01L 21/02024* (2013.01); *H01L 21/02052* (2013.01); *H01L 21/30625* (2013.01); *H01L 29/045* (2013.01); *H01L 29/1608* (2013.01); *H01L 29/34* (2013.01); *H01L 29/78* (2013.01); *H01L 29/861* (2013.01)

(58) Field of Classification Search
CPC ......... C30B 33/12; C30B 29/36; C30B 33/10; C01B 32/956; B24B 37/044; B08B 3/08; C09K 3/1409; C09G 1/02; H01L 21/02052; H01L 21/30625; H01L 29/045; H01L 29/1608
See application file for complete search history.

(56) References Cited

U.S. PATENT DOCUMENTS

2011/0278596 A1* 11/2011 Aigo ..................... C23C 16/325
257/77

FOREIGN PATENT DOCUMENTS

JP       2008-68390 A       3/2008
JP       2009-238891 A      10/2009
(Continued)

*Primary Examiner* — Selim U Ahmed
(74) *Attorney, Agent, or Firm* — Drinker Biddle & Reath LLP

(57) ABSTRACT

A silicon carbide substrate is composed of silicon carbide, and when a main surface thereof is etched with chlorine gas, the overall length of linear etch-pit groups observed in the main surface is equal to or less than the diameter of the substrate.

6 Claims, 4 Drawing Sheets

(51) Int. Cl.
*B24B 37/00* (2012.01)
*C09K 3/14* (2006.01)
*C30B 29/36* (2006.01)
*C01B 32/956* (2017.01)
*B08B 3/08* (2006.01)
*B24B 37/04* (2012.01)
*C09G 1/02* (2006.01)
*C30B 33/10* (2006.01)
*H01L 21/02* (2006.01)
*H01L 21/306* (2006.01)
*H01L 29/16* (2006.01)
*H01L 29/34* (2006.01)
*H01L 29/78* (2006.01)
*H01L 29/861* (2006.01)

(56) References Cited

FOREIGN PATENT DOCUMENTS

| | | |
|---|---|---|
| JP | 2012-004270 A | 1/2012 |
| JP | 2012-248569 A | 12/2012 |
| JP | 2013-247329 A | 12/2013 |
| WO | WO-2013/179926 A1 | 12/2013 |

* cited by examiner

SILICON CARBIDE SUBSTRATE

This is a continuation application of copending application Ser. No. 15/527,121, having a § 371 date of May 16, 2017, which is a national stage filing based on PCT International Application No. PCT/JP2015/081027, filed on Nov. 4, 2015. The copending application Ser. No. 15/527,121 is incorporated by reference herein in its entirety.

TECHNICAL FIELD

The present disclosure relates to a silicon carbide substrate, a method for producing the same, and a method for manufacturing a silicon carbide semiconductor device.

BACKGROUND ART

Silicon carbide (SiC) substrates can be used to manufacture semiconductor devices. Specifically, a semiconductor device, such as a diode or transistor, can be manufactured, for example, by forming, by epitaxial growth on a silicon carbide substrate, a semiconductor layer composed of silicon carbide, and further forming electrodes and the like on the semiconductor layer.

The quality of a semiconductor layer formed by epitaxial growth on a silicon carbide substrate is greatly influenced by the surface roughness of a main surface of the silicon carbide substrate on which the semiconductor layer is formed. Accordingly, polishing, such as mechanical polishing (MP) or chemical mechanical polishing (CMP), is performed on a main surface of a silicon carbide substrate on which a semiconductor layer is to be formed by epitaxial growth. This ensures the smoothness of the main surface on which a semiconductor layer is to be formed, and a high-quality semiconductor layer can be epitaxially grown. Furthermore, regarding polishing of silicon carbide substrates, various studies have been conducted for the purpose of ensuring the smoothness of main surfaces (for example, refer to PTL 1 and PTL 2).

CITATION LIST

Patent Literature

PTL 1: Japanese Unexamined Patent Application Publication No. 2009-238891
PTL 2: Japanese Unexamined Patent Application Publication No. 2012-248569

SUMMARY OF INVENTION

A silicon carbide substrate according to the present disclosure is composed of silicon carbide, and when a main surface thereof is etched with chlorine gas, the overall length of linear etch-pit groups observed in the main surface is equal to or less than the diameter of the substrate.

A method for producing a silicon carbide substrate according to the present disclosure includes a step of preparing a raw substrate and a step of polishing a main surface of the raw substrate by chemical mechanical polishing. The step of polishing the main surface by chemical mechanical polishing includes a step of chemically and mechanically polishing the main surface by using a polishing liquid having a permanganate ion concentration of more than 5% by mass.

DESCRIPTION OF EMBODIMENTS

Figure 1:
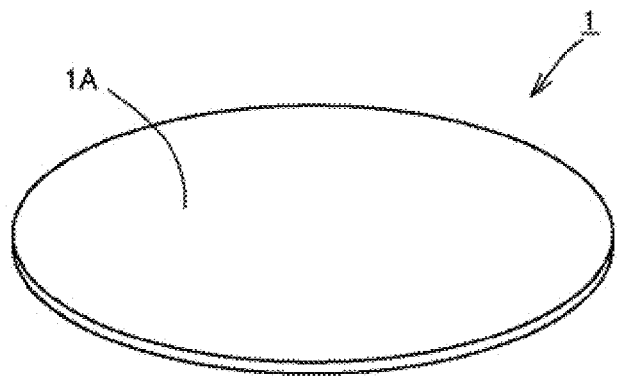
FIG. 1 is a schematic perspective view showing a form of a silicon carbide substrate.

First, embodiments of the present disclosure are enumerated and described. A silicon carbide substrate according to the present disclosure is composed of silicon carbide, and when a main surface thereof is etched with chlorine gas, the overall length of linear etch-pit groups observed in the main surface is equal to or less than the diameter of the substrate.

As described above, even in the case where a main surface of a silicon carbide substrate is smooth, when a semiconductor layer composed of silicon carbide is formed by epitaxial growth on the main surface, the quality of the semiconductor layer may become insufficient in some cases. Studies by the present inventors have shown that even if a main surface of a silicon carbide substrate is smooth, when the main surface is etched with chlorine gas and there are many linear etch-pit groups, i.e., etch-pit groups in which etch pits are linearly placed, formed on the main surface, the quality of the semiconductor layer becomes insufficient. Specifically, when the overall length of linear etch-pit groups, i.e., the total length of linear etch-pit groups observed in the main surface, is equal to or less than the diameter of the substrate, a semiconductor layer which is formed by epitaxial growth on the main surface is of high quality suitable for manufacturing a semiconductor device, such as a diode or transistor. In a silicon carbide substrate according to the present disclosure, the overall length of linear etch-pit groups observed in a main surface thereof is equal to or less than the diameter of the substrate. Consequently, according to the present disclosure, it is possible to provide a silicon carbide substrate in which a high-quality semiconductor layer can be formed on a main surface thereof.

In the silicon carbide substrate, the silicon carbide may have a hexagonal crystal structure. The main surface may be a crystal plane having an off angle of less than 8 degrees with respect to the Si plane. In the main surface corresponding to a crystal plane near the Si plane which is the (0001) plane of hexagonal silicon carbide, by setting the overall length of linear etch-pit groups to be equal to or less than the diameter of the substrate, it is possible to more reliably form a high-quality semiconductor layer on the main surface.

A method for producing a silicon carbide substrate according to the present disclosure includes a step of preparing a raw substrate and a step of polishing a main surface of the raw substrate by chemical mechanical polishing. The step of polishing the main surface by chemical mechanical polishing includes a step of chemically and mechanically polishing the main surface by using a polishing liquid having a permanganate ion concentration of more than 5% by mass.

As described above, even in the case where a main surface of a silicon carbide substrate is smooth, when the main surface is etched with chlorine gas and the overall length of linear etch-pit groups is large, it is difficult to form a high-quality semiconductor layer. The present inventors have found that, by setting the concentration of permanganate ions, which serve as an oxidizing agent, contained in a polishing liquid of CMP to be higher than that of existing techniques, it is possible to reduce the linear etch-pit groups. The reason for this is, for example, believed to be as follows.

In CMP, oxidation of a surface region of a silicon carbide substrate by an oxidizing agent and removal of the oxidized surface region by an abrasive proceed simultaneously, and thereby, the main surface of the substrate is polished. Even at the existing concentration level of the oxidizing agent, it is possible to achieve an oxidation rate that can ensure the smoothness of the surface. However, at the oxidation rate in existing CMP, when the surface region is removed by the abrasive, damage due to the abrasive is introduced in the silicon carbide substrate. Although this damage has a small influence on the smoothness of the main surface, it influences the quality of a semiconductor layer to be formed on the main surface. This damage is revealed as linear etch-pit groups by the etching with chlorine gas. By setting the concentration of permanganate ions contained in a polishing liquid of CMP at a higher level than existing techniques, specifically, to be more than 5% by mass, the oxidation rate is increased, and introduction of damage due to the abrasive is suppressed.

In the method for producing a silicon carbide substrate according to the present disclosure, the concentration of permanganate ions contained in the polishing liquid of CMP may be set to be more than 10% by mass. Thereby, in the method for producing a silicon carbide substrate according to the present disclosure, it is possible to provide a silicon carbide substrate in which a high-quality semiconductor layer can be formed on a main surface thereof.

The polishing liquid may be prepared by being passed through a PTFE resin filter with a pore diameter of 5 µm or less.

The temperature of the polishing liquid may be 35° C. or higher.

The polishing liquid may contain sodium permanganate.

In the method for producing a silicon carbide substrate, the permanganate ion concentration of the polishing liquid may be 40% by mass or less. Even when the permanganate ion concentration is increased to a level exceeding 40% by mass, the effect of suppressing damage introduced in the silicon carbide substrate is saturated. Therefore, in consideration of damage due to the oxidizing agent on polishing equipment, the permanganate ion concentration may be set to be 40% by mass or less.

In the method for producing a silicon carbide substrate, the polishing liquid may contain an abrasive composed of a metal oxide. By using, as an abrasive, a metal oxide which has higher polishing power than silicon dioxide ($SiO_2$) that is widely used as an abrasive (abrasive grains) in the method for producing a silicon carbide substrate according to the present disclosure, it is possible to achieve a high polishing rate while suppressing linear etch-pit groups. As the metal oxide constituting the abrasive, for example, aluminum oxide ($Al_2O_3$), chromium oxide ($Cr_2O_3$), zirconium oxide ($ZrO_2$), or the like may be used.

In the method for producing a silicon carbide substrate, the power of Hydrogen (pH) of the polishing liquid may be less than 5. By making the polishing liquid sufficiently acidic in the method for producing a silicon carbide substrate according to the present disclosure, it is possible to achieve a high polishing rate while suppressing linear etch-pit groups.

The method for producing a silicon carbide substrate may further include a step of cleaning the main surface which has been polished by chemical mechanical polishing. The step of cleaning the main surface may include a step of cleaning the main surface by using hydrochloric acid as a cleaning solution. By performing cleaning using hydrochloric acid, permanganate ions can be sufficiently removed from the silicon carbide substrate which has been subjected to CMP.

In the method for producing a silicon carbide substrate, the silicon carbide may have a hexagonal crystal structure. The main surface may be a crystal plane having an off angle of less than 8 degrees with respect to the Si plane. By performing the CMP on the main surface corresponding to a crystal plane near the Si plane which is the (0001) plane of hexagonal silicon carbide, it is possible to more reliably form a high-quality semiconductor layer on the main surface.

DETAILED DESCRIPTION OF EMBODIMENTS

An embodiment of a silicon carbide substrate according to the present disclosure will be described below with reference to the drawings. In the drawings below, the same reference numerals denote identical or corresponding parts, and repeated descriptions may be omitted in some cases.

Referring to FIG. 1, a silicon carbide substrate 1 in this embodiment is disk-shaped and has a main surface 1A. When the main surface 1A is etched with chlorine gas, the overall length of linear etch-pit groups observed in the main surface 1A is equal to or less than the diameter of the substrate. That is, for example, when the diameter of the substrate is 100 mm, the overall length of linear etch-pit groups is 100 mm or less. When the diameter of the substrate is 150 mm, the overall length of linear etch-pit groups is 150 mm or less. The linear etch-pit groups can be confirmed, for example, by observing with a differential interference contrast microscope the main surface 1A which has been etched with chlorine gas. Note that when the main surface 1A is etched with potassium hydroxide (KOH), the etch rate is lower than that when etched with chlorine gas. That is, in the case where the overall length of linear etch-pit groups observed in the main surface 1A when the main surface 1A is etched with KOH is approximately equal to the diameter of the substrate, there is a possibility that the overall length of linear etch-pit groups observed when the main surface 1A is etched with chlorine gas will exceed the diameter of the substrate.

The substrate diameter of the silicon carbide substrate 1 is preferably 4 inches or more (100 mm or more) in consideration of manufacturing efficiency of semiconductor devices and the like. The substrate diameter of the silicon carbide substrate 1 may be, for example, 6 inches or more (150 mm or more). The main surface 1A is a surface on which a semiconductor layer composed of silicon carbide is to be formed by epitaxial growth when a semiconductor device is manufactured using the silicon carbide substrate 1. The silicon carbide constituting the silicon carbide substrate 1 has, for example, a hexagonal crystal structure. The main surface 1A is, for example, a crystal plane having an off angle of less than 8 degrees with respect to the Si plane.

As described above, the overall length of linear etch-pit groups observed in the main surface 1A of the silicon carbide substrate 1 is equal to or less than the diameter of the substrate. Consequently, in the silicon carbide substrate 1, a high-quality semiconductor layer can be formed on the main surface 1A.

Figure 2:
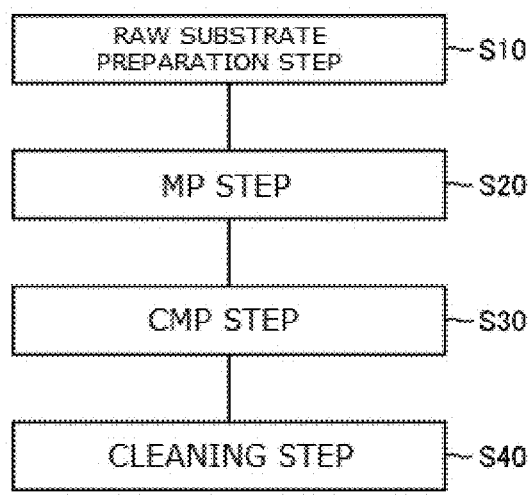
FIG. 2 is a flowchart showing an example of a method for producing a silicon carbide substrate.

Next, an example of a method for producing the silicon carbide substrate 1 will be described. Referring to FIG. 2, first, as a step (S10), a raw substrate preparation step is carried out. In the step (S10), for example, an ingot composed of hexagonal silicon carbide is sliced to obtain a disk-shaped raw substrate 1. For example, an ingot grown in the <0001> direction can be used. The ingot is sliced, for example, such that a main surface 1A having an off angle of less than 8 degrees with respect to the (0001) plane is formed.

Next, as a step (S20), an MP step is carried out. In the step (S20), mechanical polishing (MP) using hard abrasive grains is performed on the main surface 1A of the raw substrate 1 prepared in the step (S10). Thereby, the roughness of the main surface 1A of the raw substrate 1 is reduced.

Next, as a step (S30), a CMP step is carried out. In the step (S30), chemical mechanical polishing (CMP) is performed on the main surface 1A of the raw substrate 1 which has been mechanically polished in the step (S20). The CMP can be performed by using a polishing apparatus described below.

Figure 3:
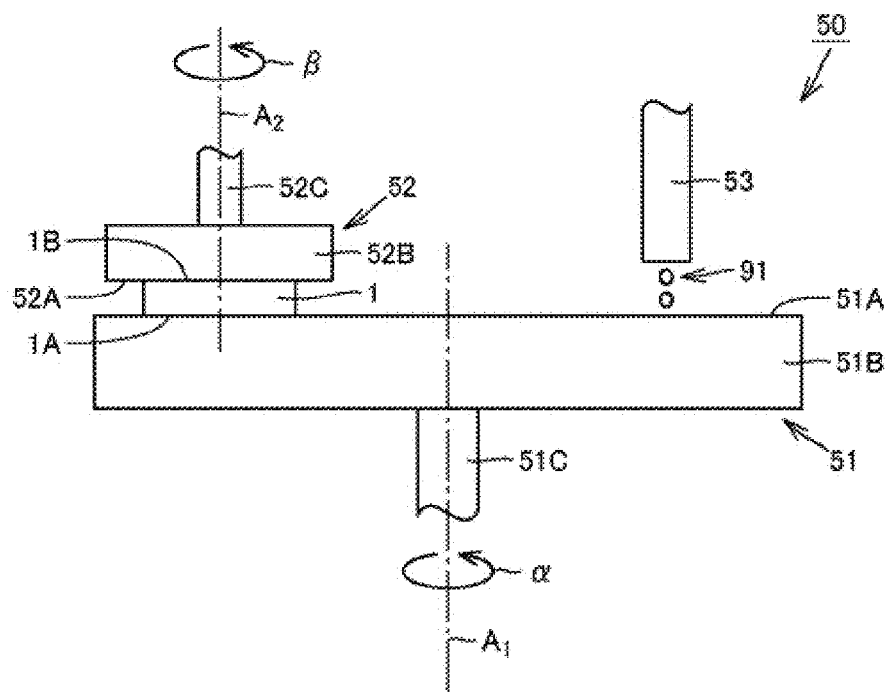
FIG. 3 is a schematic diagram showing a structure of a polishing apparatus.

Referring to FIG. 3, a polishing apparatus 50 used in this embodiment includes a polishing plate 51, a holder 52, and a polishing liquid-supplying device 53. The polishing plate 51 includes a disk-shaped body portion 51B and a shaft portion 51C which is connected to the body portion 51B so as to include the central axis $A_1$ of the body portion 51B. One main surface of the body portion 51B serves as a polishing surface 51A. The shaft portion 51C of the polishing plate 51 is connected to a drive unit such as a motor (not shown). The body portion 51B is driven by the drive unit so that it can be rotated in the direction of arrow a with the central axis $A_1$ as a rotation axis.

The holder 52 includes a disk-shaped body portion 52B and a shaft portion 52C which is connected to the body portion 52B so as to include the central axis $A_2$ of the body portion 52B. The diameter of the body portion 52B of the holder 52 is smaller than the diameter of the body portion 51B of the polishing plate 51. One main surface of the body portion 52B serves as a retaining surface 52A that retains a raw substrate 1. The shaft portion 52C of the holder 52 is connected to a drive unit such as a motor (not shown). The body portion 52B is driven by the drive unit so that it can be rotated in the direction of arrow with the central axis $A_2$ as a rotation axis. The central axis $A_1$ of the polishing plate 51 and the central axis $A_2$ of the holder 52 are parallel to each other. That is, the body portion 52B of the holder 52 and the body portion 51B of the polishing plate 51 can be rotated in the circumferential direction with different parallel central axes as a rotation axis. The rotation direction of the body portion 52B of the holder 52 may be the same as the rotation direction of the body portion 51B of the polishing plate 51 as shown in FIG. 3. The retaining surface 52A of the holder 52 faces the polishing surface 51A of the polishing plate 51.

The polishing liquid-supplying device 53 is placed above the polishing surface 51A of the polishing plate 51 at a distance from the polishing plate 51, and supplies a polishing liquid (slurry) 91 onto the polishing surface 51A. The polishing liquid-supplying device 53 is connected, for example, to a tank (not shown) that holds the polishing liquid 91, and supplies the polishing liquid 91, in a desired amount, onto the polishing surface 51A.

Next, a description will be made on CMP using the polishing apparatus 50. First, a raw substrate 1 which has been mechanically polished in the step (S20) is, for example, attached to and retained by the retaining surface 52A of the holder 52. At this time, the raw substrate 1 is retained by the holder 52 such that a main surface 1B opposite a main surface 1A, on which a semiconductor layer composed of silicon carbide is to be formed by epitaxial growth in the resulting silicon carbide substrate 1, is in contact with the retaining surface 52A. Thereby, the main surface 1A on which a semiconductor layer is to be formed faces the polishing surface 51A.

Subsequently, the polishing plate 51 and the holder 52 are rotated with the central axis $A_1$ and the central axis $A_2$ as a rotation axis, respectively. Then, the distance between the body portion 51B of the polishing plate 51 and the body portion 52B of the holder 52 is adjusted, and the polishing surface 51A of the polishing plate 51 and the main surface 1A of the raw substrate 1 are brought into contact with each other. At this time, the polishing liquid 91 is supplied from the polishing liquid-supplying device 53 onto the polishing surface 51A. Thereby, the main surface 1A of the raw substrate 1 is chemically and mechanically polished. More specifically, while a region including the main surface 1A is oxidized by an oxidizing agent contained in the polishing liquid 91, the region is removed by an abrasive contained in the polishing liquid 91, and thus CMP proceeds.

The polishing liquid 91 contains permanganate ions as an oxidizing agent. The permanganate ion concentration is more than 5% by mass. The permanganate ion concentration is, for example, 10% by mass or more and 20% by mass or less. In this case, a sufficient oxidation rate of the raw substrate 1 by the polishing liquid 91 can be ensured. The concentration of permanganate ions contained in the polishing liquid 91 may be 40% by mass or less. In this case, it is possible to suppress damage to the polishing apparatus 50 due to the oxidizing agent. The permanganate ions may be, for example, derived from a sodium (Na) salt. That is, sodium permanganate may be added as an oxidizing agent to the polishing liquid. In such a manner, the permanganate ion concentration described above can be easily achieved at normal temperature. The permanganate ions may be, for example, derived from a potassium (K) salt.

The polishing liquid 91 may be prepared by being passed through a polytetrafluoroethylene (PTFE) resin filter with a pore diameter of 5 μm or less. Furthermore, the temperature of the polishing liquid 91 may be 35° C. or higher. The reason for this is that the polishing efficiency is improved.

The polishing liquid 91 contains, for example, abrasive grains (free abrasive grains) composed of a metal oxide as an abrasive. The polishing liquid 91 may contain, for example, at least one type of abrasive grains selected from the group consisting of abrasive grains composed of $Al_2O_3$, abrasive grains composed of $Cr_2O_3$, and abrasive grains composed of $ZrO_2$. By using, as an abrasive, a metal oxide having higher polishing power than $SiO_2$, it is possible to achieve a high polishing rate while suppressing linear etch-pit groups. The average grain size of the abrasive is preferably less than 0.5 μm.

The pH of the polishing liquid 91 can be set to be less than 5. By making the polishing liquid 91 sufficiently acidic, it is possible to achieve a high polishing rate while suppressing linear etch-pit groups. The polishing liquid 91 may contain, for example, nitric acid to achieve the pH value described above. The polishing liquid 91 may contain a surfactant. The viscosity of the polishing liquid 91 can be set, for example, 0.002 Pa·s or more and 0.2 Pa·s or less.

Subsequently, as a step (S40), a cleaning step is carried out. In the step (S40), the main surface 1A of the raw substrate 1 which has been subjected to chemical mechanical polishing in the step (S30) is cleaned. Thereby, a silicon carbide substrate 1 according to this embodiment is obtained. Cleaning of the main surface 1A can be performed, for example, by using hydrochloric acid as a cleaning solution. Furthermore, after cleaning using hydrochloric acid as a cleaning solution, cleaning using water (pure water) may be performed. Thereby, the polishing liquid 91 which has adhered to the raw substrate 1 in the step (S30) is removed. Consequently, it is possible to prevent manganese (Mn) contained in the polishing liquid 91 from being incorporated into the oxide film formed on the surface of the silicon carbide substrate 1. Through the procedure described above, the method for producing a silicon carbide substrate according to this embodiment is completed.

In the method for producing the silicon carbide substrate 1 according to this embodiment, the concentration of permanganate ions contained in the polishing liquid 91 of CMP is set to be more than 10% by mass. Thereby, in the silicon carbide substrate 1, a high-quality semiconductor layer can be formed on the main surface 1A.

Examples

[Silicon Carbide Substrates]

An experiment was performed in which silicon carbide substrates 1 were formed with varied permanganate ion concentrations of the polishing liquid used in CMP in the same procedure as in the embodiment described above, and linear etch-pit groups were observed. The experiment was performed in accordance with the procedure described below.

First, a plurality of raw substrates 1 with a substrate diameter of 100 mm were prepared, and mechanical polishing was performed under the same conditions (steps (S10) and (S20)). The main surfaces 1A of the mechanically polished raw substrates 1 were each subjected to CMP using a polishing liquid 91 containing permanganate ions as an oxidizing agent, $ZrO_2$ abrasive grains as an abrasive, and nitric acid as a pH adjusting agent. The CMP was performed under the conditions: at a contact pressure of 600 g/cm$^2$, with a polishing time of 1 hour, at pH 4, and with $ZrO_2$ abrasive grains added in an amount of 15 g/L, while changing only the permanganate ion concentration in the polishing liquid 91 (step (S30)). Then, cleaning using hydrochloric acid and cleaning using pure water were performed successively under the same conditions (step (S40)), and the resulting silicon carbide substrates were used as samples.

Subsequently, the resulting samples were each etched with chlorine gas in the following procedure. First, the sample was inserted into a reaction tube, the temperature was raised to 900° C., and the pressure was reduced to 50 Pa. Next, chlorine gas was introduced into the reaction tube at a flow rate of 0.5 slm for 5 minutes to etch the sample. Then, after the pressure inside the reaction tube was reduced to 50 Pa and maintained for 30 minutes, a gas mixture containing 10% by volume of oxygen and 90% by volume of nitrogen was introduced into the reaction tube for 10 minutes at a flow rate of 2.5 slm to remove the surface carbonized layer due to chlorine gas etching from the sample. The main surfaces 1A of the resulting samples (silicon carbide substrates 1) were observed with a differential interference contrast microscope, and the overall length of linear etch-pit groups was examined.

Figure 4:
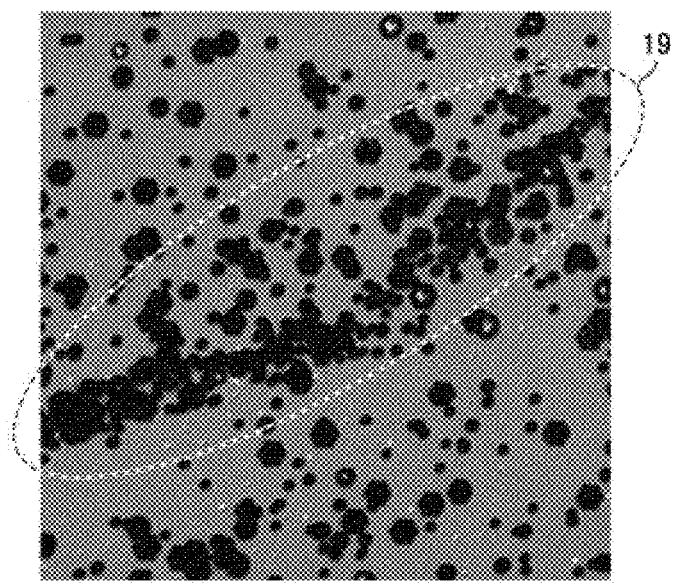
FIG. 4 is a differential interference contrast micrograph showing an example of a linear etch-pit group.

FIG. 4 is a photograph showing an example of a linear etch-pit group observed. In a linear etch-pit group 19, etch pits which are formed by etching with chlorine gas are linearly placed. The samples were each observed, and the relationships between the permanganate ion concentration of the polishing liquid 91 in CMP and each of the polishing rate and the overall length of linear etch-pit groups were examined. The examination results are shown in FIGS. 5 and 6.

Figure 5:
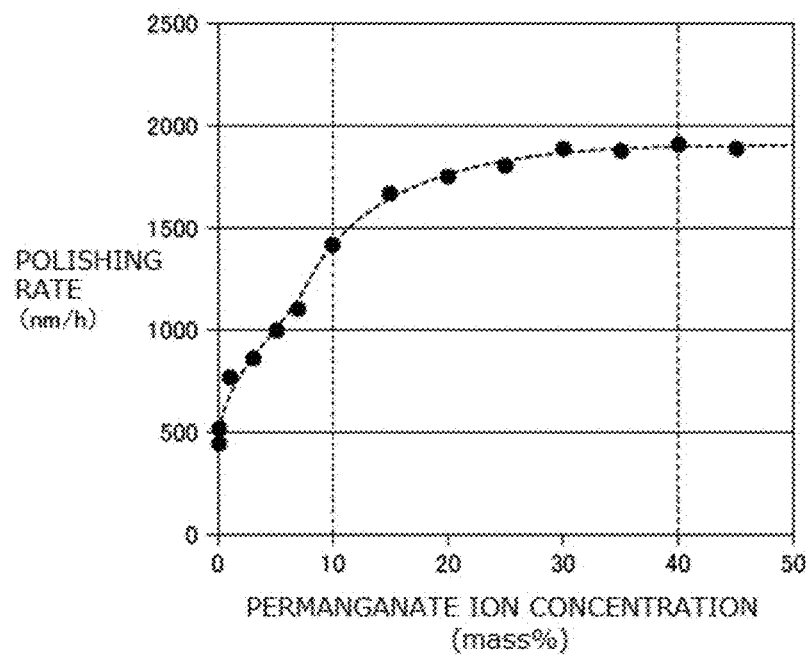
FIG. 5 is a graph showing the relationship between the permanganate ion concentration and the polishing rate.

In FIG. 5, the horizontal axis represents the permanganate ion concentration, and the vertical axis represents the polishing rate. In FIG. 6, the horizontal axis represents the permanganate ion concentration, and the vertical axis represents the overall length of linear etch-pit groups observed in the main surface 1A. Referring to FIG. 6, in the region in which the permanganate ion concentration is up to 10% by mass, the overall length of linear etch-pit groups sharply decreases with increasing permanganate ion concentration. In the region in which the permanganate ion concentration is 10% by mass or more, the overall length of linear etch-pit groups is equal to or less than the diameter of the substrate (100 mm). Furthermore, referring to FIG. 5, in the region in which the permanganate ion concentration is up to 10% by mass, the polishing rate increases with increasing permanganate ion concentration. Therefore, it can be said that the concentration of permanganate ions contained in the polishing liquid 91 should be 10% by mass or more.

Figure 6:
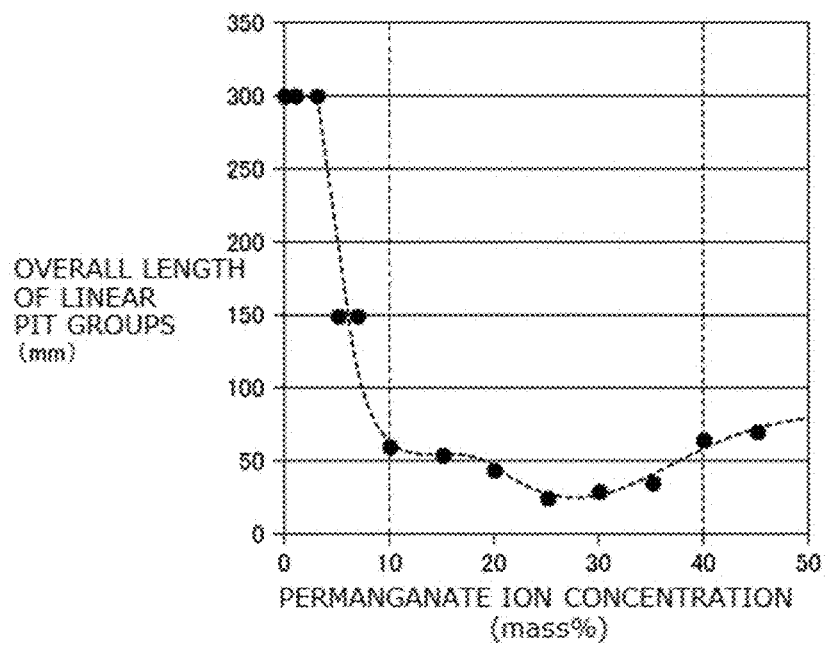
FIG. 6 is a graph showing the relationship between the permanganate ion concentration and the overall length of a linear pit group.

On the other hand, referring to FIG. 6, when the permanganate ion concentration exceeds 40% by mass, the overall length of linear etch-pit groups tends to increase. Furthermore, referring to FIG. 5, when the permanganate ion concentration exceeds 40% by mass, the increase in the polishing rate is saturated. Therefore, it is preferable to set the concentration of permanganate ions contained in the polishing liquid 91 to be 40% by mass or less. Furthermore, referring to FIG. 5, from the viewpoint of the increase in the polishing rate, it is preferable to set the permanganate ion concentration to be 15% by mass or more. In consideration of damage to the polishing apparatus due to the increase in the permanganate ion concentration, the permanganate ion concentration can be set, for example, 15% or more by mass and 20% or less by mass. Furthermore, from the viewpoint of emphasizing the decrease in the overall length of linear etch-pit groups, it is preferable to set the permanganate ion concentration to be 20% by mass or more. Furthermore, from the viewpoint of emphasizing the decrease in the overall length of linear etch-pit groups, it is preferable to set the permanganate ion concentration to be 35% by mass or less.

Regarding the detection of linear etch-pit groups, in the case where crystal defects are present in the silicon carbide substrate 1, it is preferable to distinguish linear etch-pit groups from crystal defects. Specifically, when a chlorine-etched sample is observed with a differential interference contrast microscope, linear etch-pit groups may be detected in mixture with crystal defects in some cases. Accordingly, for example, linear etch-pit groups are distinguished from crystal defects by the method described below.

First, a surface opposite the surface to be chlorine-etched is subjected to Photo Luminescence (PL) imaging measurement. Crystal defects are detected by the PL imaging measurement. Parameters in the PL imaging measurement are, for example, as follows. The wavelength of excitation light is 313 nm. The light-receiving filter is a band-pass filter with a wavelength of 390 nm and has a function of only passing light with a wavelength of 390 nm. The irradiation time of excitation light is 5 seconds. Measurement regions have a pitch of 2.3 mm square and cover the entire surface.

By subtracting the data of crystal defects obtained by PL imaging from the data obtained by the differential interference contrast microscope, linear etch-pit groups are detected.

[Percent Defective of Devices]

Figure 7:
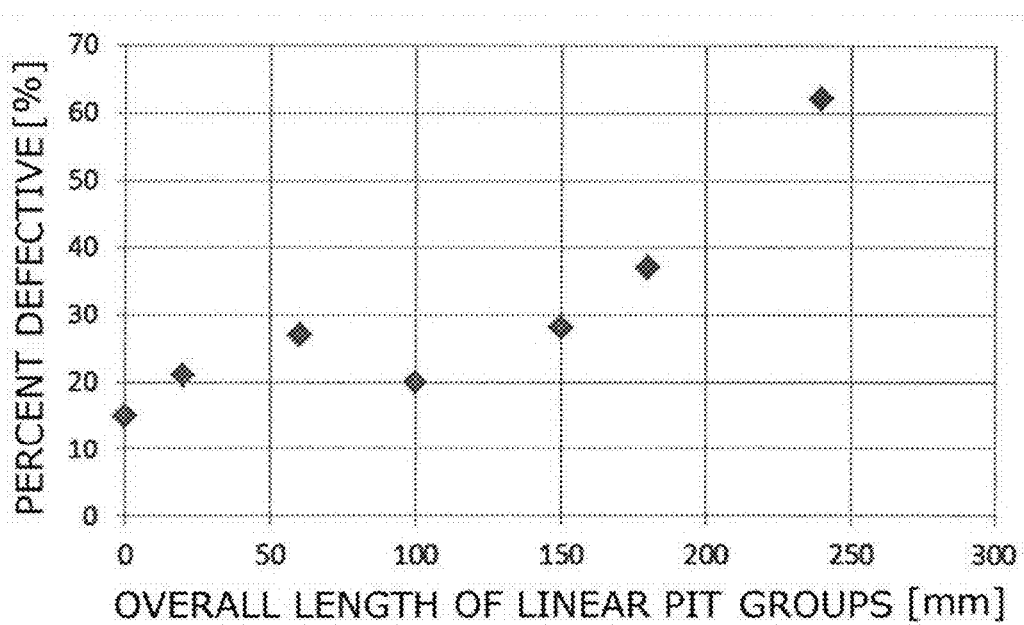
FIG. 7 is a graph showing the relationship between the length of linear etch-pit groups and the percent defective of devices.

As shown in FIG. 7, a relation is recognized between the overall length of linear etch-pit groups and the percent defective of devices. A silicon carbide substrate 1 with a diameter of 150 mm was used to fabricate devices. On the silicon carbide substrate 1, Metal-Oxide-Semiconductor Field-Effect Transistor (MOSFET) devices with a chip size of 6 mm square were formed. Defectiveness is determined from the occurrence of a leakage current of 10 nA or more when voltages from 0 V to 20 V are applied between a gate electrode and a source electrode, or the occurrence of a short circuit between a gate electrode and a source electrode, resulting in a state in which a voltage cannot be applied.

Referring to FIG. 7, in the sample in which the overall length of linear etch-pit groups is 0 mm, 20 mm, 60 mm, 100 mm or 150 mm, the percent defective is less than 30%. On the other hand, in the sample in which the overall length of linear etch-pit groups is 180 mm, the percent defective rises to 37%. Furthermore, in the sample in which the overall length of linear etch-pit groups is 240 mm, the percent defective exceeds 60%. That is, when the overall length of linear etch-pit groups exceeds 150 mm, the percent defective sharply increases. Consequently, when the overall length of linear etch-pit groups is equal to or less than the diameter of the substrate, the occurrence of defectives can be suppressed.

Furthermore, a silicon carbide semiconductor device can be manufactured by using the silicon carbide substrate 1 according to the present disclosure. In the silicon carbide semiconductor device manufactured by using the silicon carbide substrate 1 according to the present disclosure, a high-quality semiconductor layer is disposed on the main surface of the silicon carbide substrate 1, which is effective from the viewpoint of the yield and reliability.

It should be considered that the embodiment disclosed this time is illustrative and non-restrictive in all aspects. The scope of the present invention is defined not by the foregoing description but by the appended claims, and is intended to include all modifications within the meaning and scope equivalent to those of the claims.

INDUSTRIAL APPLICABILITY

The present disclosure can be particularly advantageously applied to a silicon carbide substrate in which a high-quality semiconductor layer composed of silicon carbide is required to be formed on a main surface thereof and a method for producing the same.

REFERENCE SIGNS LIST 1 silicon carbide substrate (raw substrate)
1A main surface
1B main surface
19 linear etch-pit group
50 polishing apparatus
51 polishing plate
51A polishing surface
51B body portion
51C shaft portion
52 holder
52A retaining surface
52B body portion
52C shaft portion
53 polishing liquid-supplying device
91 polishing liquid

The invention claimed is:

1. A silicon carbide substrate comprising silicon carbide, wherein, when a main surface thereof is etched with chlorine gas, an overall length of linear etch-pit groups observed in the main surface is from at least 20 mm to no more than 150 mm, a diameter of the substrate is 150 mm, and the silicon carbide has a hexagonal crystal structure.

2. The silicon carbide substrate according to claim 1, wherein the overall length of linear etch-pit groups observed in the main surface is from at least 60 mm to no more than 150 mm.

3. The silicon carbide substrate according to claim 1, wherein the overall length of linear etch-pit groups observed in the main surface is from at least 100 mm to no more than 150 mm.

4. A silicon carbide substrate comprising silicon carbide, wherein, when a main surface thereof is etched with chlorine gas, an overall length of linear etch-pit groups observed in the main surface is from at least 20 mm to no more than 150 mm, a diameter of the substrate is 150 mm, and the main surface is a crystal plane having an off angle of less than 8 degrees with respect to the Si plane.

5. The silicon carbide substrate according to claim 4, wherein the overall length of linear etch-pit groups observed in the main surface is from at least 60 mm to DO more than 150 mm.

6. The silicon carbide substrate according to claim 4, wherein the overall length of linear etch-pit groups observed in the main surface is from at least 100 mm to no more than 150 mm.

* * * * *

UNITED STATES PATENT AND TRADEMARK OFFICE
CERTIFICATE OF CORRECTION

Page 1 of 1

PATENT NO. : 10,221,501 B2
APPLICATION NO. : 15/989373
DATED : March 5, 2019
INVENTOR(S) : Tsubasa Honke and Kyoko Okita It is certified that error appears in the above-identified patent and that said Letters Patent is hereby corrected as shown below:

In the Claims

In Claim 5, Line 44, "to DO more than" should read as "to no more than"

Signed and Sealed this
Thirtieth Day of April, 2019

Andrei Iancu
*Director of the United States Patent and Trademark Office*